Sept. 27, 1966 H. REINER 3,275,894
THIN-FILM SWITCHING CIRCUIT
Filed June 10, 1964
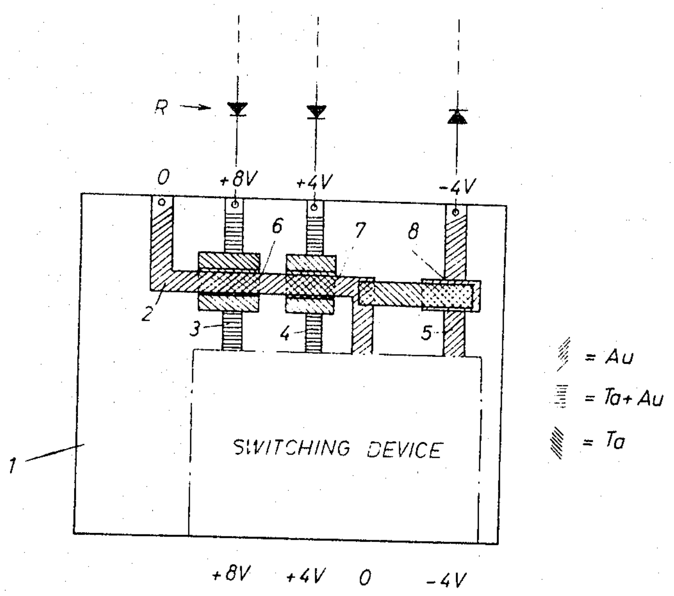
INVENTOR
HANS REINER
BY [signature]
ATTORNEY United States Patent Office 3,275,894

Patented Sept. 27, 1966

3,275,894

THIN-FILM SWITCHING CIRCUIT

Hans Reiner, Gerlingen, near Stuttgart, Germany, assignor to International Standard Electric Corporation, New York, N.Y., a corporation of Delaware Filed June 10, 1964, Ser. No. 374,129
Claims priority, application Germany, June 14, 1963, St 20,732
3 Claims. (Cl. 317—101)

The present invention relates to thin-film switching circuits, and more particularly to the arrangement of conductors in thin-film switching devices for the use in logic circuits operated at frequencies in the realm of megacycles.

When circuits use very high frequencies, shielding must be provided to avoid interstage coupling. Moreover, filters must be provided at sources of D.C. potential to convey alternating currents to ground. Examples of this usage are found in UHF broadcast and television receivers and in high speed logic circuits. As the absolute frequency increases, these demands become more exacting.

To prevent a high frequency interaction between circuits, blocking capacitors are placed between the D.C. power supply and the circuits. This tends to maintain a more constant voltage under varying load conditions. It also avoids coupling via the internal resistance of the power supply. To gain the full advantage of these blocking capacitors, the circuits should be arranged so that the shortest possible leads connect the capacitors and the associated components so that lead inductance is minimized. Moreover, the capacitor should be designed to have the lowest possible self-inductance. With high speed digital circuits, these inductances should be in the order of $10^{-9}$ H.

To accomplish these aims, prior capacitor devices have been arranged with groups of electrically conductive strips extending parallel to each other. With two groups of such strips separated by a dielectric layer, the strips can be arranged to cover each other or to cross each other and thereby form a capacitor device. Among other things, this arrangement provides an extremely low cost construction. Here though, lugs attached to the strips and wires soldered to the lugs introduce much inductance.

Accordingly, an object is to provide new and improved electronic devices for use with extremely high frequencies. In this connection, an object is to provide such devices with extremely low self inductances. More particularly, an object is to provide blocking capacitances as near to the devices as possible. Here an object is to accomplish these and other objects while maintaining the low cost construction of the assemblage.

In accordance with the invention, these and other objects are accomplished by a device using printed circuits, thin films, or the like. Voltage or power is supplied by means of printed conductors beginning at an edge of the board or film and running across the board or film to the appropriate device or component mounted or printed thereon. Running across and intersecting with these power carrying printed conductors, as close as possible to the device or component, is a printed ground lead. The printed conductor carrying the ground potential should have an extremely low resistance. The conductor carrying the voltage or power should lie in the same plane as the ground conductor. But, the two types of conductors are separated from each other to form blocking capacitors at the points where they intersect with each other. There should also be an extremely low series inductance.

An advantage of the invention is that it provides an extremely simple way of crossing the conductors printed on the same side of a printed circuit board. Another advantage is that simple and very low cost blocking capacitors are provided. Thus, high frequency operations are possible.

The above mentioned and other features of this invention and the manner of obtaining them will become more apparent, and the invention itself will be best understood by reference to the following description of an embodiment of the invention taken in conjunction with the accompanying drawing, in which:

The single sheet of drawing is a plan view which shows the principles of the invention used with a thin film device.

In the drawing, a thin film 1 provides the base material for supporting a switching device supplied from a power source of +8 v., +4 v., and —4 v. In addition, the thin film 1 may carry any other components or conductors, as required. In one exemplary embodiment, the conductors 3, 4 from the source of positive voltage was tantalum which was oxidized on its exposed surface to provide an insulating layer.

Another printed conductor 2 extends from a source of ground 0 at the edge of film 1 and runs across the positive voltage power supply conductors 3, 4 to the switching device. The intersections between the conductors 2, 3, 4 should be as near to the switching device as possible. In the exemplary construction, the ground conductor was gold which was deposited over the previously oxidized tantalum conductors by an evaporation process.

In this way, unipolar capacitors 6, 7 are formed at the intersection of the conductors 2, 3 and 2, 4. The polarity of this capacitor is determined by the construction of the layers. Since the tantalum oxide forms the insulation between the capacitor plates, it is not necessary to provide any other insulating material. However, to prevent damage to the capacitors, appropriately poled rectifiers R should be included among the wires extending from the edge of film 1 to the power supply (not shown).

The conductor 5, extending to the negative source —4, is also crossed by a ground conductor to form a blocking capacitor at 8. Here, however, the reverse construction is used so that the polarity of the capacitor 8 is reversed as compared to the polarity of the capacitors 6, 7. More specifically, the conductor 5 is gold, and a layer of oxidized tantalum extends from conductor 2 over conductor 5 to complete the ground plate of the capacitor 8.

Usually, the lead resistance should be less than one ohm for circuits such as the switching device. Tantalum has a resistance which cannot be treated as negligibly small. Thus, to reduce the lead in resistance, the tantalum may be given either a gold underplating or a gold overplating. For example, in one exemplary construction, the tantalum was overplated with gold from the edge of the board almost to the capacitors formed by the intersections. In the drawing, this gold overplating is shown by horizontal hatch lines. Also, the lead in resistance may be changed at the capacitors by widening the tantalum conductors. Thus, the drawing shows that each of the conductors 3, 4, 5 has a large rectangular shape at the intersection. The rectangle is identified by slanting hatch lines running from the upper left to the lower right. This construction provides lead in wires having little inductance so that the series inductance of the capacitor is negligibly small, approximately 0.05 $\mu$f in the exemplary construction.

While the principles of the invention have been described above in connection with specific apparatus and applications, it is to be understood that this description is made only by way of example and not as a limitation on the scope of the invention.

I claim:

1. A thin-film switching circuit for minimizing the effects of inductance in lead-in wires comprising:

a board of insulating material, a first conductor on said board including the combination of a layer of material having good conductivity and a layer of material of poor conductivity, said material of poor conductivity being oxidized in part to form a dielectric layer, a second conductor on said board composed of a good conductor arranged to cross said first conductor opposite the dielectric layer, said first and second conductors forming blocking capacitors where they cross over the dielectric layers, switching means on said board, means for connecting to positive, negative and zero potentials, said first conductor connecting between a positive potential and said switching means, and said second conductor connecting between said zero potential and said switching means.

2. A thin film circuit substantially as claimed in claim 1, in which the first conductor is primarily oxidized tantalum of poor conductivity with a layer of gold having good conductivity applied to at least a part thereof, and the second conductor is a layer of gold having good conductivity.

3. A thin film circuit substantially as claimed in claim 1, including a third conductor on said board composed of a layer of material having good conductivity, a fourth conductor on said board composed of material of poor conductivity oxidized in part to form a dielectric layer, said third conductor connecting between a negative potential and said switching means, and said fourth conductor overlapping said second conductor and said third conductor to provide a ground plate for a capacitor between said fourth and third conductors.

References Cited by the Examiner

UNITED STATES PATENTS

| | | | |
|---|---|---|---|
| 2,993,266 | 7/1961 | Berry. | |
| 3,169,892 | 2/1965 | Lemelson ---------- | 174—68.5 |

ROBERT K. SCHAEFER, *Primary Examiner.*

ROBERT S. MACON, *Examiner.*

J. J. BOSCO, *Assistant Examiner.*